United States Patent
Hirano et al.

(10) Patent No.: US 6,831,408 B2
(45) Date of Patent: Dec. 14, 2004

(54) ORGANIC ELECTROLUMINESCENCE DEVICE AND DISPLAY DEVICE

(75) Inventors: Takashi Hirano, Kanagawa (JP); Jiro Yamada, Kanagawa (JP); Yasuhiro Chiba, Kanagawa (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/395,550

(22) Filed: Mar. 24, 2003

(65) Prior Publication Data

US 2003/0171060 A1 Sep. 11, 2003

Related U.S. Application Data

(62) Division of application No. 09/628,750, filed on Jul. 31, 2000.

(30) Foreign Application Priority Data

Jul. 29, 1999 (JP) ............................................ P11-214458

(51) Int. Cl.[7] .......................... H05B 33/26; H05B 33/00
(52) U.S. Cl. ...................... 313/504; 313/503; 313/506; 428/690
(58) Field of Search ........................ 45/24, 25; 313/504, 313/506, 509, 500; 428/690

(56) References Cited

U.S. PATENT DOCUMENTS

| | | | | |
|---|---|---|---|---|
| 5,443,922 A | * | 8/1995 | Nishizaki et al. | 313/504 |
| 5,681,664 A | * | 10/1997 | Tamano et al. | 313/506 |
| 5,861,219 A | * | 1/1999 | Thompson et al. | 428/690 |
| 5,896,006 A | * | 4/1999 | Kusaka et al. | 313/506 |
| 5,940,053 A | * | 8/1999 | Ikeda | 345/77 |
| 6,057,647 A | * | 5/2000 | Kurosawa et al. | 313/506 |
| 6,120,338 A | * | 9/2000 | Hirano et al. | 445/24 |

OTHER PUBLICATIONS http://www.espimetals.com/tech/chromium.pdf*

* cited by examiner

*Primary Examiner*—Nimeshkumar D. Patel
*Assistant Examiner*—Mariceli Santiago
(74) *Attorney, Agent, or Firm*—Sonnenschein, Nath & Rosenthal LLP

(57) ABSTRACT

An organic electroluminescence device having an anode structure on the lower surface which is effective for taking out light efficiently from the cathode on the upper surface in which the organic electroluminescence device comprises an anode, a cathode and an organic layer put between both of them. The organic layer contains an organic light emitting layer that emits light by re-combination of holes supplied from the cathode A and electrons supplied from the cathode. The cathode comprises a laminate structure of an electron injecting metal layer, and a transparent conductive layer ultra thin film which is basically light permeable. The anode contains a metal belonging to the group V or group VI of the periodical table to at least a portion in contact with the organic layer and is basically light reflective. The anode metal is selected from chromium, molybdenum, tungsten, tantalum and niobium. The anode metal has a work function of 4.8 eV or lower.

22 Claims, 6 Drawing Sheets

F I G. 4
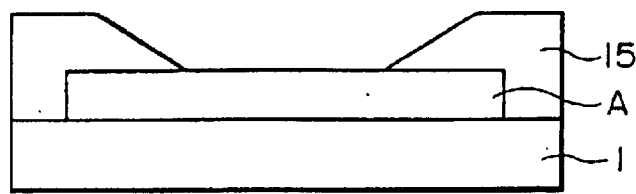
F I G. 5
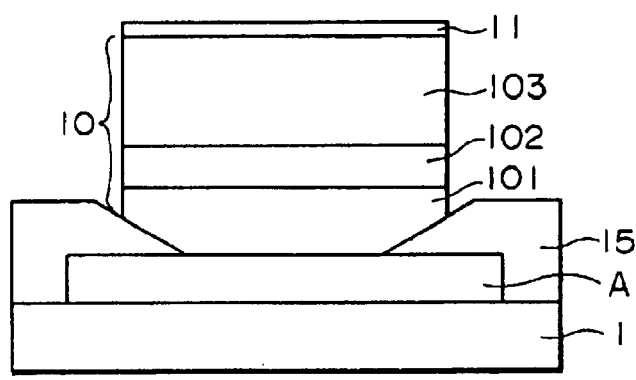
F I G. 6
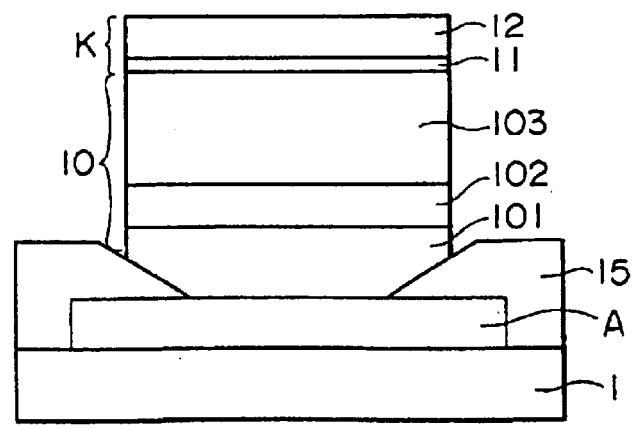

F I G. 11
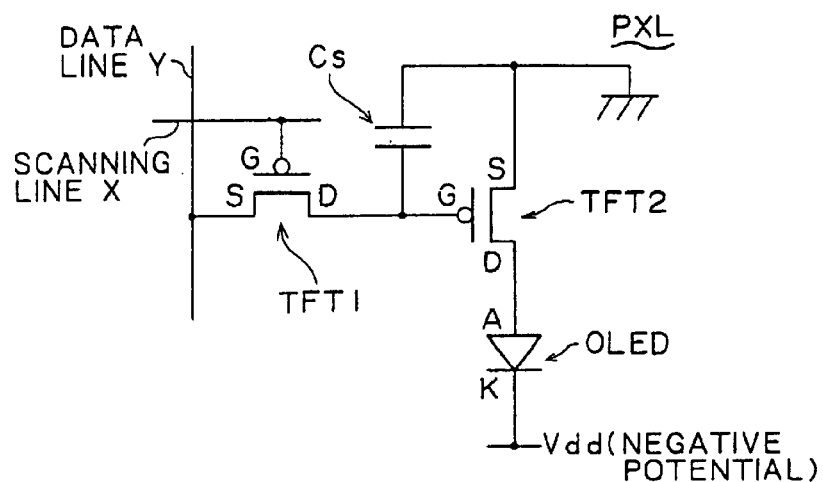
F I G. 12
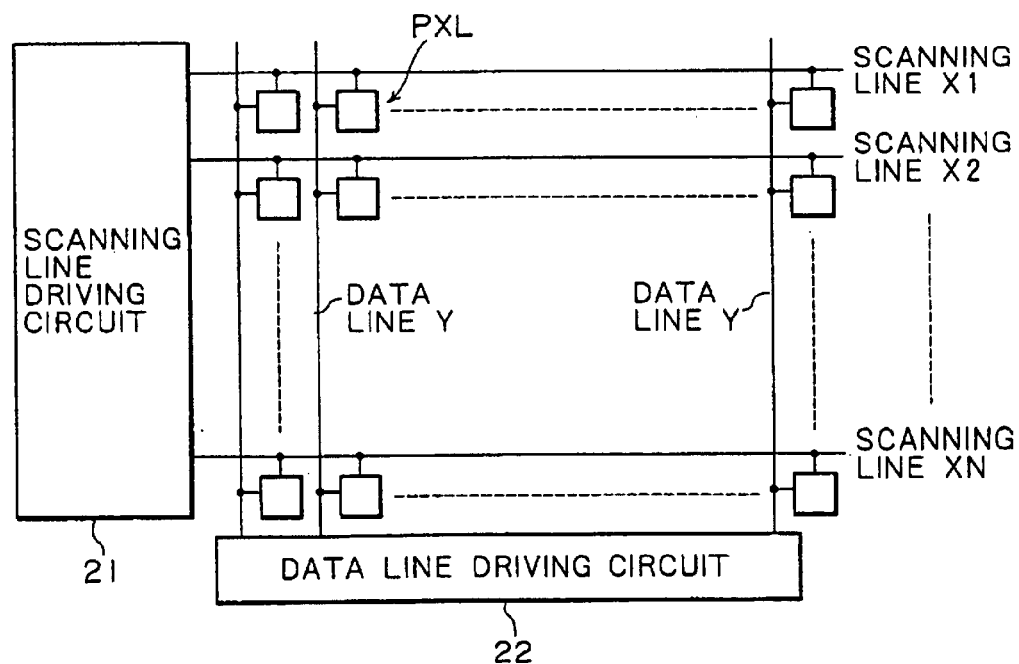

ORGANIC ELECTROLUMINESCENCE DEVICE AND DISPLAY DEVICE

The present application claims priority to Japanese Application No. P11-214458, filed Jul. 29, 1999 and is a divisional of U.S. application Ser. No. 09/628,750, filed on Jul. 31, 2000, both of which are incorporated herein by reference to the extent permitted by law.

BACKGROUND OF THE INVENTION

1. Field of the Invention

This invention concerns an organic electroluminescence device capable of taking out emission of light on the side of a cathode of the device.

2. Description of Related Art

Electroluminescence devices utilizing electroluminescence (hereinafter simply referred to as an EL device) have been noted for the use of them as light emitting devices in various kinds of display devices since they have features of high visibility due to self-emission and excellent impact resistance being a completely solid devices.

The EL devices include inorganic EL devices using inorganic compounds as the light emitting material and organic EL devices using organic compounds as the light emitting material. Among them, since the organic EL devices can be easily reduced in the size with a driving voltage lowered remarkably studies intending for their practical use have been made earnestly as display devices in next generation. The organic EL device basically adopts a structure comprising a lamination of anode/light emitting layer/cathode in which a transparent electrode formed on a substrate using a glass plate or the like (usually adopt). In this case, emission light is taken out on the side of the substrate.

By the way, it has been attempted to take out emission light from the side of the cathode by making the cathode transparent because of the following reasons in recent years. At first, when the anode is made transparent together with the cathode, a light emission device transparent as a whole can be provided. An optional color can be adopted as the background color for the transparent light emission device, and a display which is colorful in a state other than light emission can be obtained, to enhance the decorative property. When black is adopted for the background color, contrast upon emission is improved. Next, when a color filter or a color conversion device is used, such component can be placed on the light emission device. Accordingly, the device can be manufactured with no particular consideration on these layers. As the merit of this, for example, a substrate temperature can be made higher upon forming the anode thereby enabling to lower the resistance value of the anode.

Since the foregoing advantages can be obtained by making the cathode transparent, it has been attempted to manufacture an organic EL device by using a transparent cathode. For example, Japanese Patent Laid-Open Hei 10-162959 disclose an organic EL device in which an organic layer containing an organic light emitting layer is interposed between an anode and a cathode, and the cathode comprises an electron injecting metal layer and an amorphous transparent conductive layer, and the electron injecting metal layer is in compact with the organic layer. For illustrating the background of the invention, constitutions described above will be explained briefly.

At first, the amorphous transparent conductive layer constituting the cathode in the organic EL device is to be explained. Any of amorphous transparent conductive layers may be used so long as it is amorphous and has transparency and it preferably comprises a specific resistivity of $5\times10^{-4}$ $\Omega\cdot$cm or lower for avoiding voltage drop and not uniform light emission attributable to this. Further, In—Zn—O series oxide films are preferred for the material. In—Zn—O series oxide layer is a transparent conductive film comprising an amorphous oxide containing indium (In) and zinc (Zn) as main cationic elements.

Then, the electron injecting metal layer is to be explained. The electron injecting metal layer is a layer of a metal capable of satisfactorily injecting electrons to an organic layer containing a light emitting layer. It is desirable that the light transmittance is 50% or higher for obtaining a transparent light emitting device and, for this purpose, an ultra thin film of about 0.5 to 20 nm thickness is desirable. The electron injecting metal layer can include, for example, those layers of 1 nm to 20 nm film thickness by using metals having a work function of 3.8 eV or lower (electron injecting metal), for example, Mg, Ca, Ba, Sr, Li, Yb, Eu, Y and Sc. A constitution providing light transmittance of 50% or more, particularly, 60% or more is preferred in this case.

The organic layer interposed between the anode and the cathode contains at least a light emitting layer. The organic layer may be a layer only consisting of a light emitting layer, or it may be a multi-layered structure in which a hole injecting/transporting layer or the like is laminated together with the light emitting layer. In the organic EL device, the organic layer has (1) a function capable of injecting holes by the anode or the hole transport layer and capable of injecting electrons from the electron injecting layer, (2) a transporting function of moving the injected charges (electrons and holes) under the effect of an electric field and a light emitting function of providing re-combination sites of electrons and holes in the inside of the light emitting layer and providing light emission therefrom. The hole injecting/transporting layer is a layer comprising a hole transfer compound, which has a function of transmitting holes injected from the anode to the light emitting layer, in which more holes are injected to the light emitting layer at a lower electric field by interposing the hole injecting/transporting layer between the anode and the light emitting layer. In addition, electrons injected from the electron injecting layer in the light emitting layer are accumulated near the boundary in the light emitting layer by the energy barrier present at the boundary between the light emitting layer and the hole injecting/transporting layer thereby improving the emission efficiency of the EL device and providing an EL device of excellent emitting performance.

There is no particular restriction on the anode so long as the anode shows conductivity of the work function of 0.8 eV or higher. A metal, a transparent conductive film (conductive oxide film) or combination of them having a work function of 4.8 eV or higher is preferred. It is not always necessary that the anode is transparent and, for example, a carbon layer of black color may be coated. Suitable metal can include, for example, Au, Pt, Ni and Pd and suitable conductive oxide can include, for example, In—Zn—O, In—Sn—O, ZnO—Al and Zn—Sn—O. Further, the laminate can include, for example, a laminate of Au and In—Zn—O, a laminate of Pt and an In—Zn—O and a laminate of an In—Sn—O and Pt. Since it may suffice that the boundary with the organic layer in the cathode has a work function of 4.8 eV or higher, the anode may be formed as a dual layer in which a conductive film of a work function of 4.8 eV or lower may be used on the side not in contact with the organic layer. In this case, a metal such as Al, Ta or W or an alloy such as Al alloy or Ta—W alloy may also be used. Furthermore, a conductive polymers such as doped polyaniline or doped polyphenylenevinylene, an amorphous semiconductor such as α-Si, α-SiC or α-C or crystallite such as a μC-Si or μC-SiC may also be used. Furthermore, $Cr_2O_3$, $Pr_2O_5$, NiO, $Mn_2O_5$ or $MnO_2$ as black semiconductive oxide may also be used.

As has been described above, Japanese Patent Laid-Open Hei 10-162959 discloses a technique of taking out light from the side of the cathode by forming the cathode with an ultra-thin electron injecting metal layer and an amorphous transparent conductive layer. However, improvement for the anode is not mentioned. That is, the literature contains no descriptions for the anode on the lower side which is effective for efficiently taking out light from the cathode on the upper side. It merely describes that the use of a metal, a transparent conductive film or a combination of them with conductivity showing a work function of 4.8 eV or higher can be used for the anode. It mentions to Au, Pt, Ni and Pd as suitable metals. However, such metals can not be said to have satisfactory adhesion with the organic layer but tend to cause dark spots (non-emission point) or not uniform light emission. Further, fine fabrication technique for the metal has not yet been established and highly fine pattering is difficult.

SUMMARY OF THE INVENTION

In view of the technical subjects in the prior art described above, this invention intends to provide an organic electroluminescence device having an anode constitution on the lower side which is effective to efficiently take out light from the cathode on the upper side.

The purpose of the invention can be attained in accordance with this invention in an organic electroluminescence device comprising an anode, a cathode and an organic layer put between them, in which the organic layer contains an organic light emitting layer that emits light by re-combination of holes supplied from the anode and electrons supplied from the cathode, wherein the anode contains a metal belonging to the group V or group VI of the periodical table to at least a portion in contact with the organic layer.

Preferably, the metal is selected from chromium, molybdenum, tungsten, tantalum and niobium, The work function of the metal is 4.8 eV or lower. Further, the anode has a reflectance of 40% or higher.

The anode is light reflecting while the cathode is light permeable and emission light is mainly emitted from the side of the cathode.

Preferably, the cathode, the organic layer and the anode are laminated orderly from above to a substrate.

This invention also includes a display device utilizing the organic electroluminescence device described above for a pixel.

That is, a display device according to this invention basically has a constitution in which scanning lines for selecting pixels and data lines for providing luminance information for driving the pixels are arranged in a matrix, each of the pixels comprises an organic electroluminescence device that emits light in accordance with the amount of current supplied, a first active element controlled by the scanning lines and having a function of writing the luminance information given from the data lines to the pixels and, a second active element having a function of controlling the amount of current supplied to the organic electroluminescence device in accordance with the written luminance information, the luminance information is written to each of the pixels by applying electric signals in accordance with the luminance information to the data lines in a state where the scanning line is selected, the luminance information written in each of the pixels is held in each of the pixels even after the scanning line becomes no more selected, and the organic electroluminescence device in each of the pixels can maintain the light emission at a luminance in accordance with the luminance information.

The organic electroluminescence device comprises an anode, a cathode and an organic layer put between them and the organic layer contains an organic light emitting layer that emits light by re-combination of holes supplied from the anode and electrons supplied from the cathode.

The anode contains a metal belonging to the group V or group VI of the periodical table to at least a portion in contact with the organic layer.

The metal is preferably selected from chromium, molybdenum, tungsten, tantalum and niobium.

Further, the metal has a work function of 4.8 eV or lower.

Further, the cathode has a reflectance of 40% or higher. The anode is light reflecting and the cathode is light permeable in which emission light is mainly emitted from the side of the cathode.

Each of the pixels is accumulated and formed on the substrate, and the organic electroluminescence device contained in each of the pixels comprises the cathode, the organic layer and the anode laminated in this order from above to the substrate.

According to this invention, the anode of the organic electroluminescence device comprises a metal belonging to the group V or group VI of the periodical table. The metal can include high melting metals such as chromium, molybdenum, tungsten, tantalum and niobium. Such metals have a work function of 4.8 eV or lower, for example, chromium having 4.5 eV and tungsten having 0.6 eV. Further, the reflectance is 40% or higher.

Metals having somewhat higher work function of 4.8 eV or higher (Au, Pt, Ni, Pd, etc.) have been adopted for the anode so far in view of the requirement of supplying holes. In this invention, metals belonging to the group V or the group VI having lower work function (Cr, Mo, W, Ta, Nb, etc.) are used. It has been confirmed that even the metals belonging to the group V or the group VI can effectively supply the holes. Rather, chromium (Cr) and the like have less defects and excellent fabricability compared with gold (Au) and the like, as well as they are excellent as a whole as a material for the anode of the organic electroluminescence device.

BRIEF DESCRIPTION OF THE ACCOMPANYING DRAWINGS

FIG. 4 is a step chart also showing a method of manufacturing the organic EL device according to this invention;

FIG. 5 is a step chart also showing a method of manufacturing the organic EL device according to this invention;

FIG. 6 is a step chart view also showing a method of manufacturing the organic EL device according to this invention;

FIG. 11 is an equivalent circuit diagram showing one pixel of a display device according to this invention;

FIG. 12 is a block diagram showing an entire constitution of the display device according to this invention.

DESCRIPTION OF THE PREFERRED EMBODIMENTS

Preferred embodiments of this invention are to be explained in details with reference to the drawings.

Figure 1:
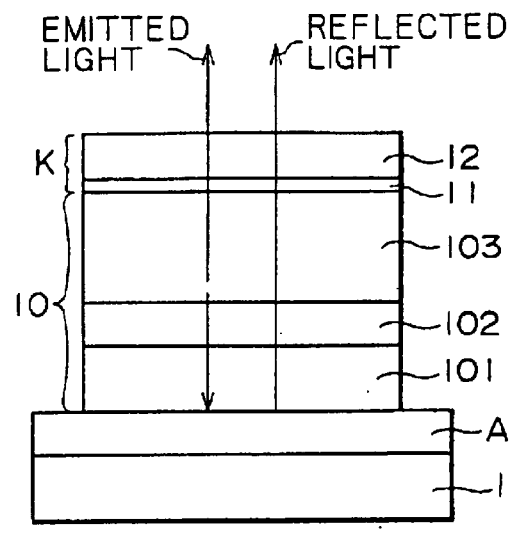
FIG. 1 is a cross sectional view showing a basic constitution of an organic EL device according to this invention.

FIG. 1 is across sectional view showing a basic constitution of an organic electroluminescence device according to this invention. As shown in the drawing, the organic electroluminescence device comprises an anode A, a cathode K and an organic layer 10 put between both of them. The organic layer 10 contains an organic light emitting layer 103 that emits light by re-combination of holes supplied from the anode A and electrons supplied from the cathode K. Further, the organic layer contains a hole injection layer 101 and a hole transparent layer 102. The cathode K has a laminate structure of an electron injecting metal layer 11 and a transparent conductive layer 12 each of an extremely reduced thickness. As the feature, the cathode A contains a metal belonging to the group V or group VI of the periodical table to at least a portion in contact with the organic layer 10. The anode metal is preferably selected from chromium, molybdenum, tantalum and niobium. Further, the anode metal has a work function of 4.8 eV or lower, for example, chromium having 4.5 eV and tungsten having 0.6 eV. Further, the reflectance of the anode A comprising such metal is 40% or higher. That is, the anode is light reflecting and the cathode is light permeable in which emission light is mainly emitted from the side of the cathode. The cathode K, the organic layer 10 and the anode A are laminated in this order from above to the substrate 1.

The anode A may be a single layer of pure metal, as well as a lamination layer or an alloy. Basically, it may suffice that the metal belonging to the group V or group VI of the periodical table is contained at a portion in contact with the organic layer 10. The anode A comprises a metal, an alloy or a laminate thereof.

For example, when a chromium film was formed to a 200 nm thickness as the anode A on the glass substrate 1 and the reflectance thereof was measured, it was 67% at a wavelength of 460 nm. Further, as the cathode K, an ultra-thin electron injecting metal layer 11 comprising an Mg:Ag alloy was formed to a extremely reduced film thickness of 10 nm and, further, a transparent conductive layer 12 was formed to a thickness of 200 nm being stacked thereon. When the transmittance of the laminated cathode K was measured at a wavelength 460 nm, it was 53%. When 8 volt voltage was applied between the anode-cathode of the organic EL device formed as shown in the figure by using the anode A and the cathode K described above, a current of 20 mA/cm$^2$ was observed, and emission luminance of 900 cd/m$^2$ was observed from the side of the cathode K. A considerable amount of emission light directed toward the anode A is reflected and proceeds oppositely and is then emitted from the cathode A. Favorable carrier injection characteristics and light emission characteristics could be confirmed. Further, no dark spots were observed on the light emitting surface.

Figure 2:
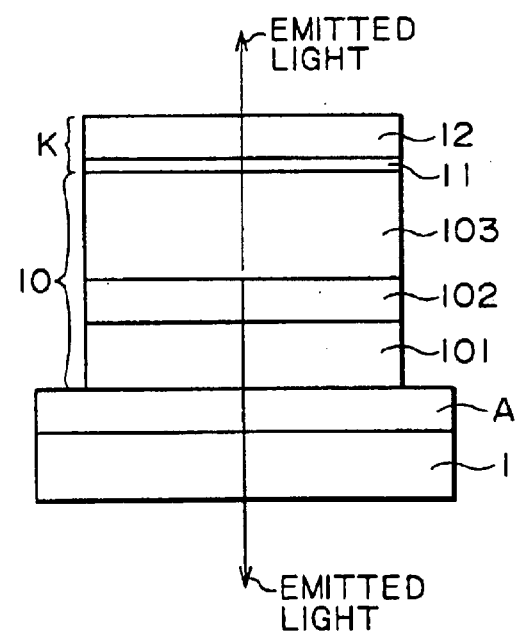
FIG. 2 is a cross sectional view showing a constitution of an organic EL device according to a reference embodiment.

As a comparative example, an organic EL device shown in FIG. 2 was prepared. The constitution was basically identical with that illustrated in FIG. 1, in which corresponding portions carry corresponding reference numerals. An organic EL device was manufactured in the same manner as that in FIG. 1 excepting that the anode A was made of a transparent conductive film ITO. When 8 volt of voltage was applied between anode-cathode of the thus manufactured organic EL device, a current of 23 mA/cm$^2$ was observed but the emission luminance from the cathode K was as low as 250 cd/m$^2$ compared with the organic EL device shown in FIG. 1. This indicates that the emission light transmitted in the direction of the anode A was scarcely reflected but emitted from the glass substrate 1. As apparent from the result of comparison described above, since the organic EL device manufactured according to this invention can effectively take out emission light generated in the organic light emitting layer 103 from the upper surface, satisfactory light emission on the upper surface can be obtained.

Figure 3:
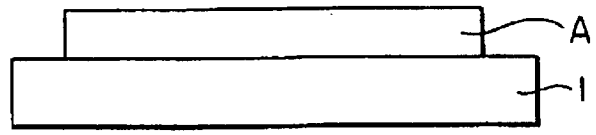
FIG. 3 is a step chart showing a method of manufacturing the organic EL device according to this invention.

Now, a method of manufacturing an organic EL device according to this invention is to be explained in details with reference to FIG. 3 to FIG. 6. In this embodiment, chromium was used as the anode comprising the metal, chromium has a work function of 4.5 eV. As shown in FIG. 3, chromium (Cr) was formed to a film thickness of 200 nm on a glass substrate 1 by DC sputtering. Sputtering was conducted using argon (Ar) as a sputtering gas under a pressure of 0.2 Pa and with DC power of 300 W. It was patterned to a predetermined shape by using ordinary lithography. It was fabricated by using ETC-1 as an etching solution (manufactured by Sanyo Kasei Industry Co.). An anode A of a predetermined shape can be obtained. Chromium can be fabricated at a high accuracy and good reproducibility by the etching solution. When a higher fabrication accuracy is required, it may be fabricated by dry etching. As the etching gas, a gas mixture of chlorine ($Cl_2$) and oxygen ($O_2$) can be used. Particularly, fabrication can be applied at a high accuracy and the shape of the etched surface can be controlled by using reactive ion etching (RIE). The device can be fabricated into a tapered shape by etching under predetermined conditions thereby enabling to reduce cathode-anode short circuit.

As shown in FIG. 4, an insulative layer 15 is formed on the substrate 1 on which chromium was fabricated into a predetermined pattern. There is no particular restriction on the material used for the insulative layer 15 and silicon dioxide ($SiO_2$) was used in this embodiment. $SiO_2$ was formed to a film of 200 nm thickness by sputtering. There is no particular restriction for the method of forming the film. $SiO_2$ was fabricated so as to form an opening on chromium by using ordinary lithography. A mixed solution of hydrofluoric acid and ammonium fluoride can be used for the etching of $SiO_2$. Further, fabrication by dry etching is also possible. The opening forms a light emitting portion of the organic EL device. Although the insulative layer 15 is not essential in this invention, it is desirably disposed in order to prevent anode-cathode short circuit.

Successively, as shown in FIG. 5, the glass substrate 1 formed with chromium and $SiO_2$ was placed in a vacuum vapor deposition apparatus and an organic layer 10 and a metal layer 11 of the cathode K were formed by vapor deposition. In this organic layer 10, 4, 4', 4"-tris(3-methylphenylamino) triphenylamine (MTDATA) was used as a hole injecting layer 101, bis(N-naphthyl)-N- phenylbendizine (α-NPD) was used as a hole transporting layer 102 and 8-quinolinol aluminum complex (Alq) was used as the light emitting layer 103.

An alloy of magnesium and silver (Mg:Ag) was used as the metal layer 11 of the cathode K. Each of the materials for the organic layer 10 was filled in a boat for ohmic resistance each by 0.2 g and then attached to a predetermined electrode in the vacuum vapor deposition apparatus. For the metal layer 11, magnesium was filled by 0.1 g and silver was filled by 0.4 g to a boat and attached to a predetermined electrode of the vacuum vapor deposition apparatus.

After reducing the pressure in the vacuum chamber to $1.0 \times 10^{-4}$ Pa, voltage is applied to each of the boats and heated gradually to conduct vapor deposition. In vapor deposition, the organic layer 10 and the metal layer 11 comprising Mg:Ag were vapor deposited only to a predetermined portion by using a metal mask. The predetermined portion is a portion in which chromium is exposed on the substrate 1. Since it is difficult to conduct vapor deposition at high accuracy only to the portion where the chromium is exposed, a vapor deposition mask was designed so as to cover the entire portion where the chromium was exposed (so as to extend to the edge of the insulative layer 15).

At first, there were deposited MTDATA by 30 nm as the hole injecting layer 101, α-NPD by 20 nm as the hole transporting layer 102 and Alq by 50 nm as the light emitting layer 103. Further, Mg:Ag was formed as the metal layer 11 of the cathode K on the organic layer 10 by conducting co-vapor deposition of magnesium and silver. The film forming rate was set to 9:1 between magnesium and silver. The thickness for the film of Mg:Ag is made to 10 nm.

Finally, as shown in FIG. 6, the device was transferred in another vacuum chamber, and a transparent conductive layer 12 was formed through an identical mask. DC sputtering was used for the film formation. In this embodiment, an In—Zn—O series transparent conductive film showing good conductivity in film formation at a room temperature was used as the transparent conductive layer 12. The film was formed by sputtering under the conditions of using a gas mixture of argon and oxygen (volume ratio $Ar:O_2=1000:5$) and under a pressure of 0.3 Pa with a DC power of 40 W. The film was formed to a thickness of 200 nm.

As the material for the anode A, tungsten may also be used in addition to chromium. In this case, tungsten (W) was formed to a thickness of film thickness of 200 nm on the glass substrate by DC sputtering. Sputtering was conducted using argon (Ar) under a pressure of 0.2 Pa with a DC power of 300 W. Then, patterning was applied by dry etching. $CF_4$ or $SF_6$ can be used as the etching gas. Particularly, fabrication at high accuracy is possible and the shape of the etching circuit can be controlled by using the reactive ion etching (RIE). When etching is applied under a predetermined condition, the device can be fabricated into a tapered shape thereby enabling to decrease cathode-anode short circuit. Succeeding steps were identical with those for chromium.

Figure 7:
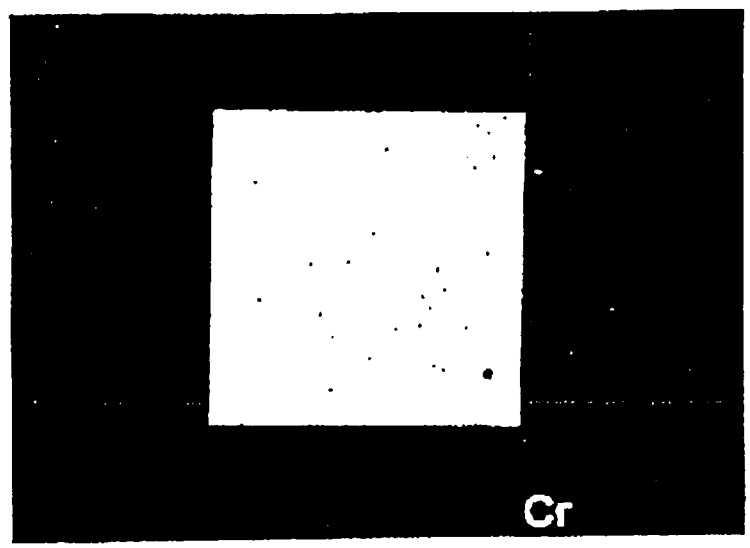
FIG. 7 is an enlarged plan view showing a light emitting surface of an organic EL device.
Figure 8:
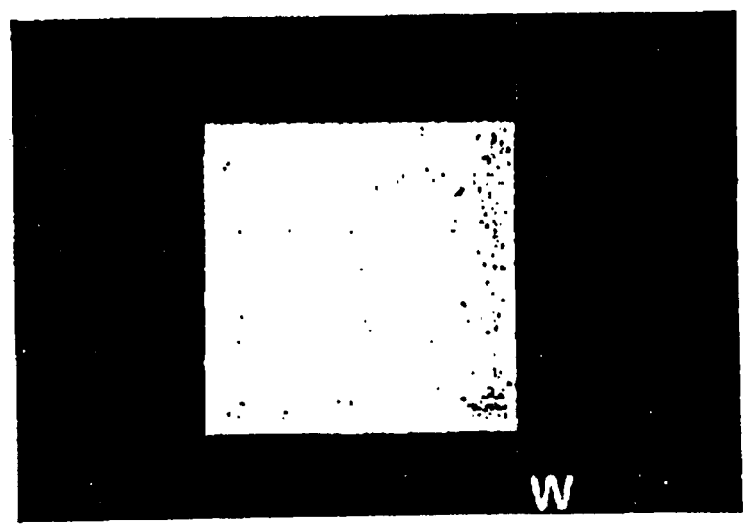
FIG. 8 is an enlarged plan view also showing a light emitting surface of an organic EL device.
Figure 9:
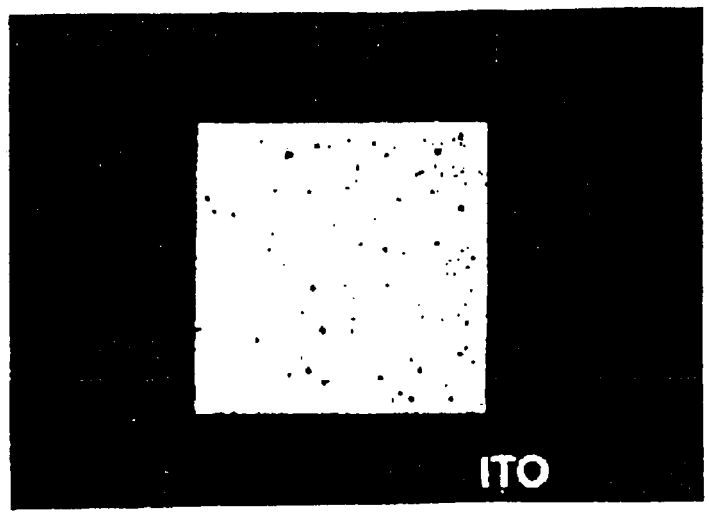
FIG. 9 is an enlarged plan view also showing a light emitting surface of an organic EL device.
Figure 10:
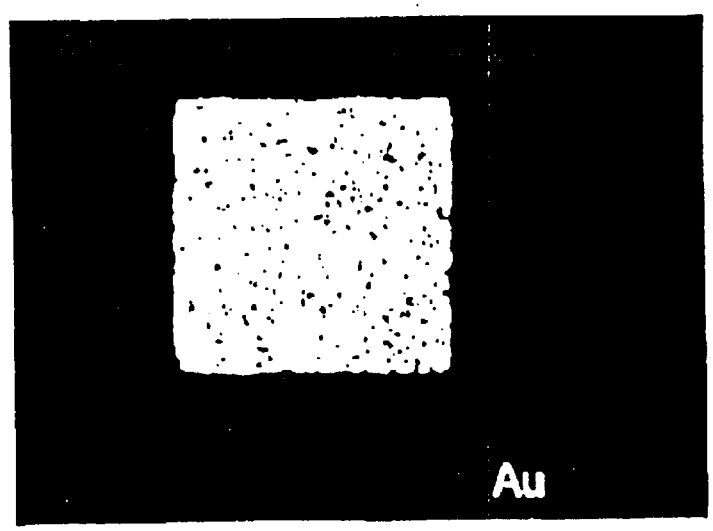
FIG. 10 is an enlarged plan view also showing a light emitting surface of an organic EL device.

Then, the appearance and the characteristics of the organic EL device are explained with reference to FIG. 7 to FIG. 10. FIG. 7 is a photograph taken for the light emitting surface of the embodiment using chromium (Cr) for the anode A. The light emitting surface is of 2 mm square and dark spots are observed slightly (non-light emission point). FIG. 8 is a photograph taken for the light emitting surface of the embodiment using tungsten (W) for the anode A. The light emitting surface is of 2 mm square and dark spots are also observed slightly (non-light emission point) FIG. 9 is a photograph taken for the light emitting surface of a reference example by using ITO as the anode A in which considerable amounts of dark spots (non-emission point) are observed. FIG. 10 is a photograph taken for the light emitting surface of the reference example using gold (A8) as the anode A in which a great amount of dark spots (non-light emission point) are observed. This is attributable to poor adhesion between gold and the organic layer.

Finally, a display device using the organic EL device of this invention for the pixel is to be explained. Generally, in active matrix type display devices, images are displayed by arranging a plurality of pixels in a matrix and controlling the intensity of light on every pixels in accordance with given luminance information. In a case where liquid crystals are used as an electro-optical substance, the transmittance of the pixel changes in accordance with the voltage written in each of the pixels. Also in the active matrix type display device using the organic electroluminescence material as the electro-optical substance, the basic operation is identical with that using the liquid crystals. However, different from the liquid crystal display, the organic EL display is a self-emission type having alight emitting device in each of the pixels, and provides merits such as higher visibility of images compared with the liquid crystal display, not requiring back light and high response speed. The luminance of individual light emitting devices is controlled by the amount of current. That is, the organic EL display is greatly different from the liquid crystal display in that the light emitting device is of a current driven type or a current control type.

In the same manner as in the liquid crystal display, the organic EL display can also adopt a simple matrix system and an active matrix system as the driving system. Since the former has a simple structure but it is large in the scale and difficult to attain display at high fineness, development has been conducted vigorously for the active matrix system. In the active matrix system, current flowing to the organic EL device disposed to each of the pixel is controlled by an active element disposed inside of the pixel (generally a thin film transistor as a kind of insulated gate type field effect transistors, (hereinafter sometimes referred to as TFT)). For the organic EL display of the active matrix system, an equivalent circuit for one pixel is shown in FIG. 11. The pixel PXL comprises an organic EL device OLED, a thin film transistor TFT1 as a first active element, a thin film transistor TFT2 as a second active element and a holding capacitance Cs. Since the organic EL device often has a rectifying property, it may sometimes be called as OLED (Organic Light Emitting Diode) and it is denoted by a symbol for a diode. In the illustrated embodiment, the source S of TFT2 is defined as a reference potential (ground potential) and the cathode K of OLED is connected to Vdd (power source potential), while the anode A of OLED is connected to a drain D of TFT2. On the other hand, the gate G of TFT1 is connected to a scanning line X, the source S of TFT1 is connected to data line Y, and the drain D thereof is connected to the holding capacitance Cs and the gate G of TFT2.

For operating the PXL, when the scanning line X is at first when selected, and a data potential Vdata indicative of the luminance information is applied to the data line Y, TFT1 becomes conductive and the holding capacitance Cs is charged or discharged to align the gate potential of TFT2 with the data potential Data. When the scanning line X is put to non-selected state, TFT1 turns off while TFT2 is electrically isolated from the data line Y, and the gate potential of TFT2 is held stably by the holding capacitance Cs. The current flowing through TFT2 to the organic EL device OLED takes a value in accordance with gate/source voltage Vgs of TFT2, and OLED emits light continuously at a luminance in accordance with the amount of current supplied from TFT2.

As has been described above, in the circuit structure of the pixel PXL shown in FIG. 11, when Vdata is once written, OLED emits light continuously at a constant luminance during one frame till the next rewriting. When such pixels PXL are arranged in plurality in a matrix as shown in FIG. 12, an active matrix type display device can be constituted.

As shown in FIG. 12, in this display device, scanning lines X1 to XN for selecting the pixels PXL and data lines Y giving the luminance information (data potential Vdata) for driving the pixels PXL are arranged in a matrix. The scanning lines X1 to XN are connected to a scanning line driving circuit 21, while the data lines Y are connected to a data line driving circuit 22. Desirable images can be displayed by repetitive writing of Vdata from the data lines Y by the data line driving circuit 22. In the simple matrix type display device, the light emitting device contained in each of the pixels PXL emits light only for the selected instance whereas, in the active matrix type display device shown in FIG. 12, since the organic EL device of each of the pixels PXL emits light continuously also after the completion of writing, it is advantageous, particularly, in a large scale and highly fine display in that the peak luminance (peak current) of the organic EL device can be lowered compared with the simple matrix type.

Figure 13:
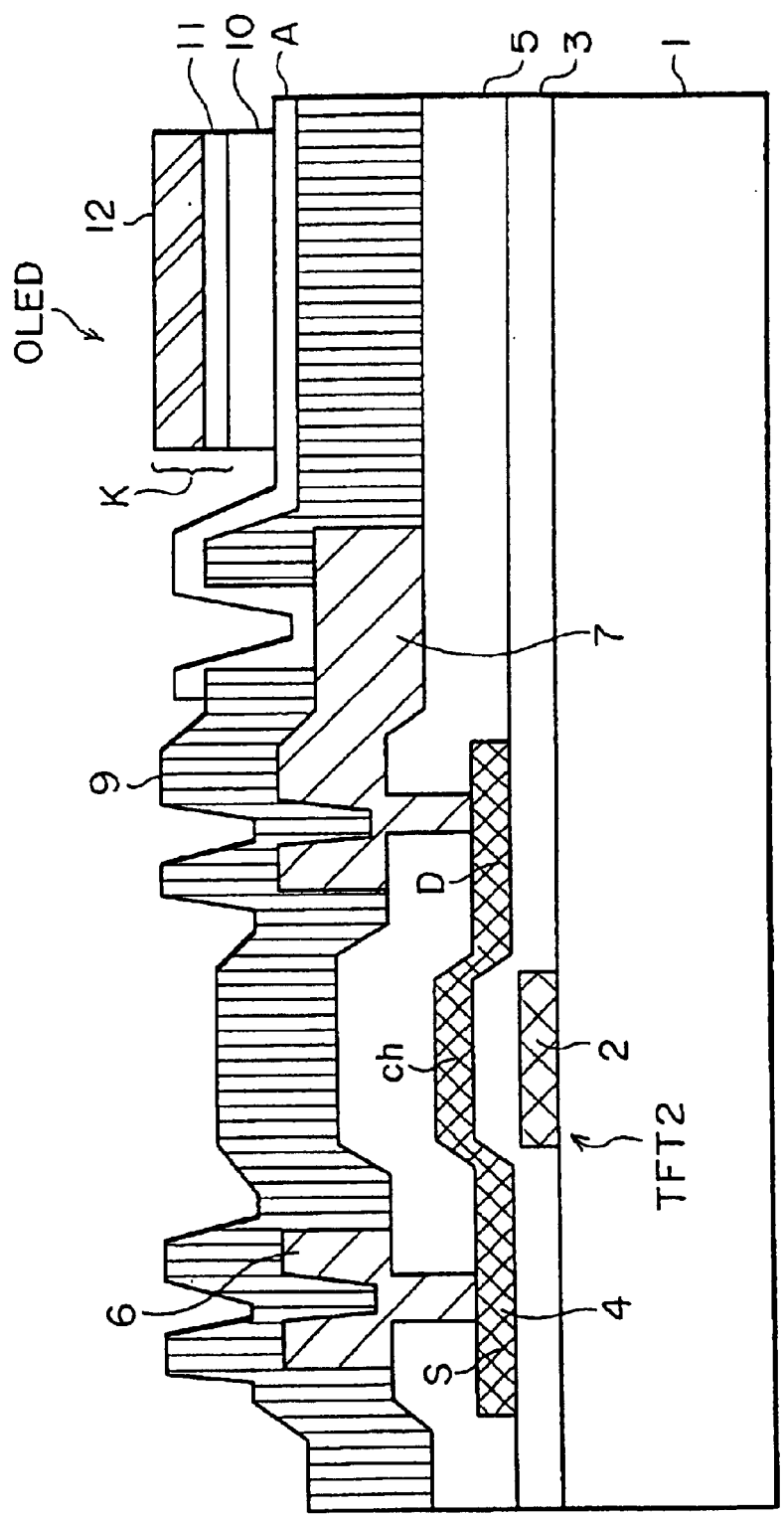
FIG. 13 is a cross sectional view showing a structure of the display device according to this invention.

FIG. 13 schematically shows a cross sectional structure of the pixel PXL shown in FIG. 11. For easy illustration, only OLED and TFT2 are shown. OLED comprises an anode A, an organic layer 10 and a cathode K stacked successively in this order. The anode A is isolated on every pixel and, in accordance with this invention, the anode A comprises for example chromium and is basically light reflective. The cathodes K are connected in common between the pixels and each comprises, for example, a laminate structure of a metal layer 11 and a transparent conductive layer 12 and which is basically light permeable. When a forward voltage (about 10 V) is applied between anode A and cathode K of OLED having such a constitution, injection of carriers such as electrons or holes is taken place and light emission is observed. It is considered that the operation of OLED is light emission by exciting units formed with holes injected from the anode A and electrons injected from the cathode K.

On the other hand, TFT2 comprises a gate electrode 2 formed on a substrate 1, for example, made of glass, a gate insulative film 3 superposed on the upper surface thereof and a semiconductor thin film 4 stacked by way of the gate insulative film 3 above the gate electrode 2. The semiconductor thin film 4 comprises, for example, a polycrystal silicon thin film. TFT2 comprises a source S, a channel Ch and a drain D forming a channel for the current supplied to OLED. The channel Ch is situated just above the gate electrode 2. TFT2 of the bottom gate structure is covered with an interlayer insulative film 5, on which are formed a source electrode 6 and a drain electrode 7. The OLED described above is formed as a film by way of another interlayer insulative film 9 thereon.

As has been explained above according to this invention, light emitted from the light emitting layer can be taken out efficiently from the upper electrode side as the cathode. By using a metal having a higher reflectance than that of the transparent conductive film as the anode, light conducted to the anode is reflected and taken out of the upper electrode side. Further, in this invention, a satisfactory light emitting efficiency can be obtained. It can provide a substantially identical hole injecting efficiency substantially identical with that using the transparent conductive film (for example, ITO) according to this invention.

Further, it forms less dark spots (non-light emission point) observed upon light emission. In addition, the anode can be patterned at high accuracy. A display at high fineness can be manufactured easily. Furthermore, the structure and the process are simple. In a case of forming the anode with ITO as in the prior art, a reflection layer such as a metal maybe disposed therebelow but the structure and the process are more complicated compared with this invention. Further, since the light can be taken out efficiently from the side of the upper surface electrode, an organic EL device of large opening ration can be manufactured on a glass substrate formed with TFT. In a case of taking out light from the lower electrode, since TFT does not transmit light therethrough, only several % of opening ratio can be obtained. Accordingly, it is possible to manufacture an active matrix system display of high performance by using the organic EL device according to this invention.

What is claimed is:

1. A method of manufacturing an electroluminescence device, the method comprising the steps of:
    forming a first electrode having a metal belonging to the group V or the group VI of the periodic table on a substrate;
    forming an organic light emitting layer so as to be in contact with the metal; and
    forming a second electrode on the organic light emitting layer,
    wherein the first electrode has a reflectance of 40% or higher, and
    wherein the metal includes at least one of niobium, tantalum, and molybdenum.

2. A manufacturing method as claimed in claim 1, wherein the first electrode is in a tapered type.

3. A manufacturing method as claimed in claim 1, wherein the metal has a work function of 4.8 eV or lower.

4. A manufacturing method as claimed in claim 1, wherein first electrode has a higher reflectance than the second electrode.

5. A manufacturing method as claimed in claim 1, wherein the first electrode comprises an alloy.

6. A manufacturing method as claimed in claim 1, wherein the organic light remitting layer has a hole transporting layer for transporting holes injected from the first electrode.

7. A manufacturing method as claimed in claim 1, wherein the second electrode comprises a layer comprising a metal and a transparent material.

8. A method of manufacturing an electroluminescence device, the method comprising the steps of:
    forming a first electrode having a metal belonging to the group V or group VI of the periodic table on a substrate;
    forming an insulative film on the first electrode;
    forming an opening in the insulative film and exposing the metal;
    forming an organic light emitting layer so as to be in contact with the metal through the opening; and
    forming a second electrode on the organic light emitting layer,
    wherein the first electrode has a reflectance of 40% or higher, and
    wherein the metal includes at least one of niobium, tantalum, and molybdenum.

9. A manufacturing method as claimed in claim 8, wherein the first electrode is in a tapered type.

10. A manufacturing method as claimed in claim 8, wherein the a metal has work function of 4.8 eV or lower.

11. A manufacturing method as claimed in claim 8, wherein the first electrode has a higher reflectance than the second electrode.

12. A manufacturing method as claimed in claim 8, wherein the first electrode comprises an alloy.

13. A manufacturing method as claimed in claim 8, wherein the organic light remitting layer has a hole transporting layer for transporting holes injected from the first electrode.

14. A manufacturing method as claimed in claim 8, wherein the second electrode comprises a layer comprising a metal and a transparent material.

15. A method of manufacturing an electroluminescence device, the method comprising the steps of:

forming a gate electrode on a substrate;

forming a gate insulative film on the gate electrode;

forming a semiconductor layer on the gate insulative film;

forming an insulative film on the semiconductor layer;

forming a first electrode having a metal belonging to the group V or group VI of the periodic table on the insulative film;

forming an organic light emitting layer so as to be in contact with the metal; and forming a second electrode on the organic light emitting layer, wherein the first electrode has a reflectance of 40% or higher, and wherein the metal includes at least one niobium, tantalum, and molybdenum.

16. A manufacturing method as claimed in claim 15, wherein the first electrode is in a tapered type.

17. A manufacturing method as claimed in claim 15, wherein the metal has a work function of 4.8 eV or lower.

18. A manufacturing method as claimed in claim 15, wherein the first electrode has a higher reflectance than the second electrode.

19. A manufacturing method as claimed in claim 15, wherein the first electrode comprises an alloy.

20. A manufacturing method as claimed in claim 15, wherein the organic light remitting layer has a hole transporting layer for transporting holes injected from the first electrode.

21. A manufacturing method as claimed in claim 15, wherein the second electrode comprises a layer comprising a metal and a transparent material.

22. A manufacturing method as claimed in claim 15, wherein the substrate comprises glass and the gate insulative film has a thickness less than that of the insulative film.

* * * * *